(12) United States Patent
Motoyama (10) Patent No.: US 7,426,226 B2
(45) Date of Patent: Sep. 16, 2008

(54) DRIVE CIRCUIT AND DRIVE METHOD FOR SEMICONDUCTOR LIGHT SOURCE

(75) Inventor: Hajime Motoyama, Moriya (JP)

(73) Assignee: Canon Kabushiki Kaisha, Tokyo (JP)

( * ) Notice: Subject to any disclaimer, the term of this patent is extended or adjusted under 35 U.S.C. 154(b) by 135 days.

(21) Appl. No.: 11/275,901

(22) Filed: Feb. 2, 2006

(65) Prior Publication Data

US 2006/0187981 A1    Aug. 24, 2006

(30) Foreign Application Priority Data

Feb. 22, 2005    (JP)    ............... 2005-046226

(51) Int. Cl.
*H01S 3/00* (2006.01)
(52) U.S. Cl. ............... 372/38.02; 372/38.1; 372/38.04; 372/38.07
(58) Field of Classification Search ............... 372/38.1, 372/38.02, 38.07, 38.04
See application file for complete search history.

(56) References Cited

U.S. PATENT DOCUMENTS 6,236,579 B1    5/2001    Watanabe et al. ............. 363/25

2003/0011865 A1*    1/2003    Kimura ............... 359/237

FOREIGN PATENT DOCUMENTS

| JP | 2000-284898 | * | 10/2000 |
| JP | 2000-284998 | * | 10/2000 |
| JP | 2002-269792 |   | 9/2002  |
| JP | 2003-29217  |   | 1/2003  |

\* cited by examiner

*Primary Examiner*—Dung T Nguyen
(74) *Attorney, Agent, or Firm*—Fitzpatrick, Cella, Harper & Scinto (57) ABSTRACT

A circuit for driving a semiconductor laser including a semiconductor integrated circuit, which controls the drive of the semiconductor laser, and is connected to one end of the semiconductor laser. Moreover, the driving circuit incorporates a first power source +Vcc that supplies by way of the semiconductor integrated circuit a drive voltage to one end of the semiconductor laser and a second power source −Vcc, which is connected to the other end of the semiconductor laser and supplies a drive voltage to the other end. Furthermore, the drive circuit incorporates a voltage clamp circuit, connected to a connection terminal connecting the semiconductor laser and the semiconductor integrated circuit, for adjusting the electric potential of the connection terminal.

5 Claims, 7 Drawing Sheets

DRIVE CIRCUIT AND DRIVE METHOD FOR SEMICONDUCTOR LIGHT SOURCE

FIELD OF THE INVENTION

This invention relates to a drive circuit for driving a semiconductor light source such as a semiconductor laser or a laser diode, and its drive method.

BACKGROUND OF THE INVENTION

In electrophotographic equipment utilizing semiconductor-laser light for exposure, it is conceivable to reduce the spot diameter of laser light in order to obtain high image quality and high stability. In general, by shortening the wavelength of laser light, the spot diameter can be readily reduced. Infrared-laser light utilized in general laser printers is approximately 780 nm in wavelength, and red-laser light is approximately 650 nm in wavelength; therefore, the spot diameter can simply be reduced by 80%. Furthermore, blue-laser light is approximately 400 nm in wavelength, and therefore has as an advantage that the spot diameter can be reduced by approximately 50%.

Japanese Patent Application Laid-Open No. 2003-29217 (corresponding to U.S. Patent Application Publication No. US-2003-011865-A1) and Japanese Patent Application Laid-Open No. 2002-269792 propose circuits for driving semiconductor lasers.

However, in general, when the spot diameter of laser light is reduced, the forward voltage required for luminescence is higher than that in the case of a larger spot diameter. Accordingly, in order to reduce the spot diameter of laser light, a high-voltage-proof IC must be used and consequently productivity is reduced. In other words, one desired feature is to reduce the spot diameter of laser light while applying a low voltage to an IC.

For example, the forward voltage for a blue laser to emit light is 5.5 V and therefore higher than the power-source voltage (5 V) of general ICs. Accordingly, in order to drive an IC a blue laser, a high-voltage-proof IC must be used and consequently problems of cost arise. Moreover, although it is possible to conceive a drive circuit with discrete electronic components for which voltage can readily be raised, the problem of high-speed switching remains.

SUMMARY OF THE INVENTION

According to the present invention, the foregoing object is attained by providing a drive circuit for on/off-driving of a semiconductor light source. A semiconductor integrated circuit to drive the semiconductor laser is connected to one end of the semiconductor laser. A first power source supplies a drive voltage to one end of the semiconductor laser, by way of a semiconductor integrated circuit. A second power source is connected to the other end of the semiconductor laser and supplies a drive voltage to the other end. A voltage clamp circuit, connected to a connection terminal connecting the semiconductor laser and the semiconductor integrated circuit, adjusts the electric potential of the connection terminal.

According to the present invention, in addition to the power source for the drive IC to operate, the power source for driving the laser diode, a high-voltage laser diode can be driven by a drive IC having a low withstanding voltage.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

Preferred embodiments for implementing the present invention will be explained in detail below, with reference to the accompanying drawings. However, the embodiments describe constituent elements for illustrative purposes only and do not intend to limit the scope of the present invention. In addition, in each of the drawings, similar parts are designated with persistent reference numerals, and duplicate descriptions are omitted.

First Embodiment

<Given Technology>

Figure 7:
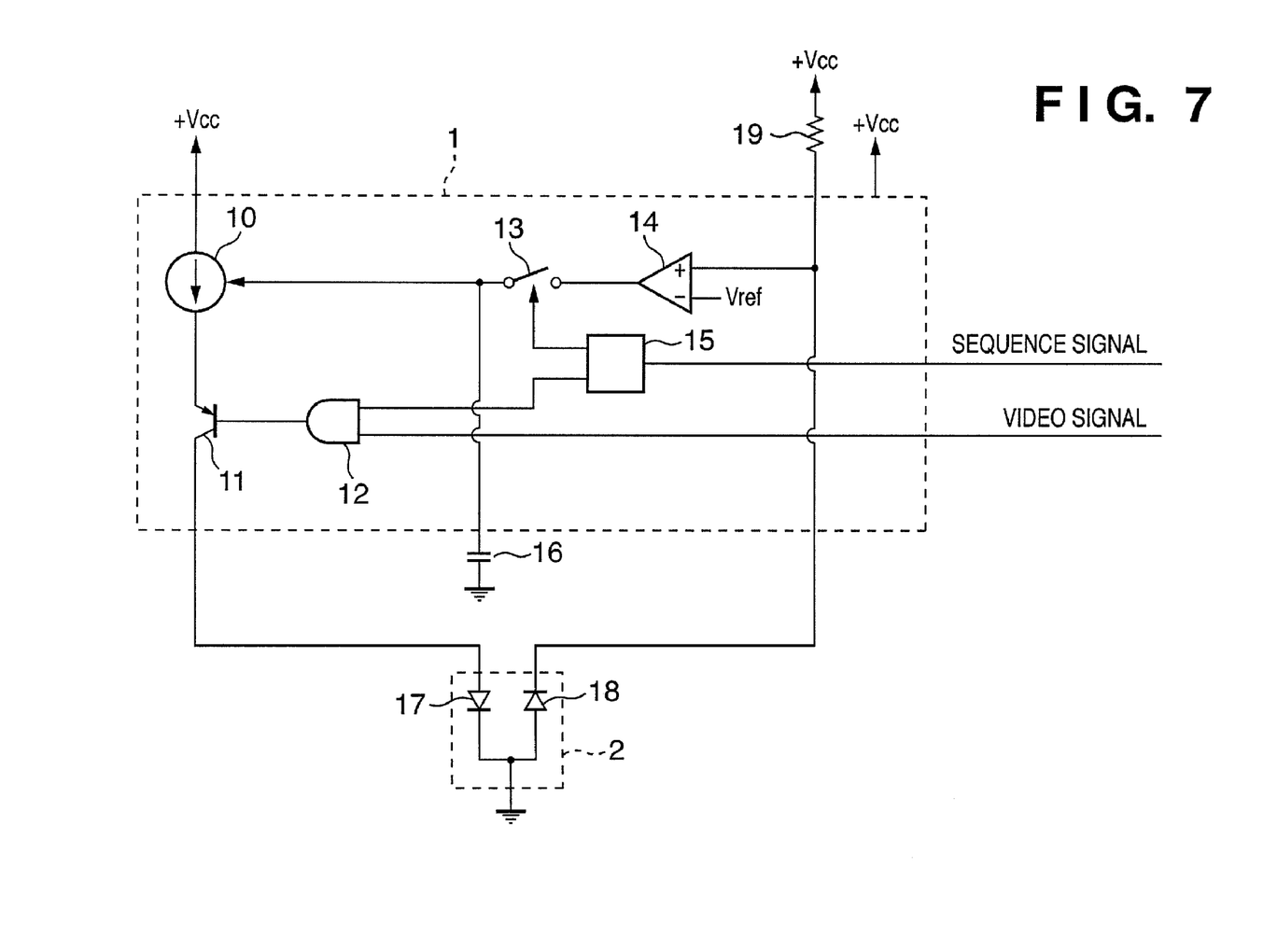
FIG. 7 is a circuit diagram explaining prior art technology.

FIG. 7 is a diagram illustrating a given drive circuit technology for a semiconductor light source in accordance with the First Embodiment of the present invention. In FIG. 7, drive IC 1 has an internal configuration as illustrated within the dotted-line area.

A light emitting device 2 includes a laser diode 17 and a photo diode 18. The laser diode 17 is one of a kind of semiconductor laser. The cathode terminal of laser diode 17 and the anode terminal of the photo diode 18 form a common terminal that is grounded. The cathode terminal of the photo diode 18 is connected via resistor 19 to a power source Vcc, and a DC bias voltage is applied to the photo diode 18. A current source 10 is also connected to the power source Vcc.

The cathode terminal of the photo diode 18 is also connected to the "+" input terminal of error amplifier 14. A reference voltage Vref is applied to the "−" input terminal of the error amplifier 14. The output terminal of the error amplifier 14 is connected to an analog switch 13. The analog switch 13 triggers the ON/OFF control in accordance with the output of logic circuit 15. The logic circuit 15 receives a sequence signal from a sequence controller (not shown).

The output of the analog switch 13 is inputted into the current source 10 and functions as a signal to control the current outputted from the current source 10. A capacitor 16 is connected between the output terminal of the analog switch 13 and the ground. The output of the current source 10 is inputted into the emitter of switching element 11. The collector of the switching element 11 is connected to the anode of the laser diode 17. The base of the switching element 11 is connected to the output of a logical AND circuit 12. A logic signal from the logic circuit 15 and a video signal from an image controller (not shown) are fed into the AND circuit 12.

The operation in FIG. 7 will be explained below. Laser-drive methods used in electrophotographic equipments are categorized into several modes. In our case, the APC (Auto Power Control) luminescence mode, which implements constant light amount control will be explained.

First, in the non-image-forming areas within each of the main scanning lines, the APC luminescence assures to keep the light amount of the laser diode constant. The state of the APC mode is decided in accordance with the sequence signal from a controller (not shown). The logic circuit 15 enables or disables the analog switch 13 and inputs a Lo-level signal to the AND circuit 12.

Regardless of the video signal, the AND circuit 12 inputs the Lo-level signal to the switching element 11, whereby the switching element 11 is turned on. In this situation, when the laser diode 17 irradiates, monitor light enters the photo diode 18 causing an induced current. The induced current flows through the resistor 19. If Imon and R denote the induced current and the resistance value, respectively, a voltage of R×Imon occurs.

As a result, the input voltage to the "+" input terminal of the error amplifier 14 decreases. When the input voltage becomes Vref or lower, the output of the error amplifier 14 decreases, and the control input to the current source 10 is reduced. When the control input to the current source 10 decreases, the output current of the current source 10 also decreases, and the input current to the laser diode 17 is reduced. Consequently, the light amount decreases.

When the light amount decreases, the induced current in the photo diode 18 is reduced, and the input voltage to the "+" input terminal of the error amplifier 14 increases. When the input voltage becomes Vref or higher, the output of the error amplifier 14 increases, and the control input to the current source 10 increases.

With the control input being increased, the output current of the current source 10 also increases, and the input current to the laser diode 17 increases, which increases the light amount. As described above, the present configuration forms a negative feedback circuit which operates in such a way that the equation "R×Imon=Vref" is held. Because R and Vref are fixed values, Imon is constant, but proportional to the amount of light outputted from the laser diode 17. Thus, a control is implemented in such a way that the amount of light outputted from the laser diode 17 remains constant.

Next, the operation of the image-forming mode, in the image-forming area, will be explained. First, the state of the image-forming mode is decided in accordance with the sequence signal from the controller (not shown). The logic circuit 15 enables or disables the analog switch 13.

Additionally, the logic circuit 15 inputs a Hi-level signal to the AND circuit 12. The voltage in the previous APC mode is maintained across the capacitor 16 and because the voltage functions as the control voltage for the current source 10, the current source 10 provides a constant current. In this case, the controller (not shown) inputs to the AND circuit 12 the video signal based on image data. Accordingly, the switching element 11 controls the ON/OFF-switching operation with respect to the video signal.

As a result, it is possible to obtain a stable image forming since current is supplied to the laser diode 17 in accordance with the current source 10.

Figure 2:
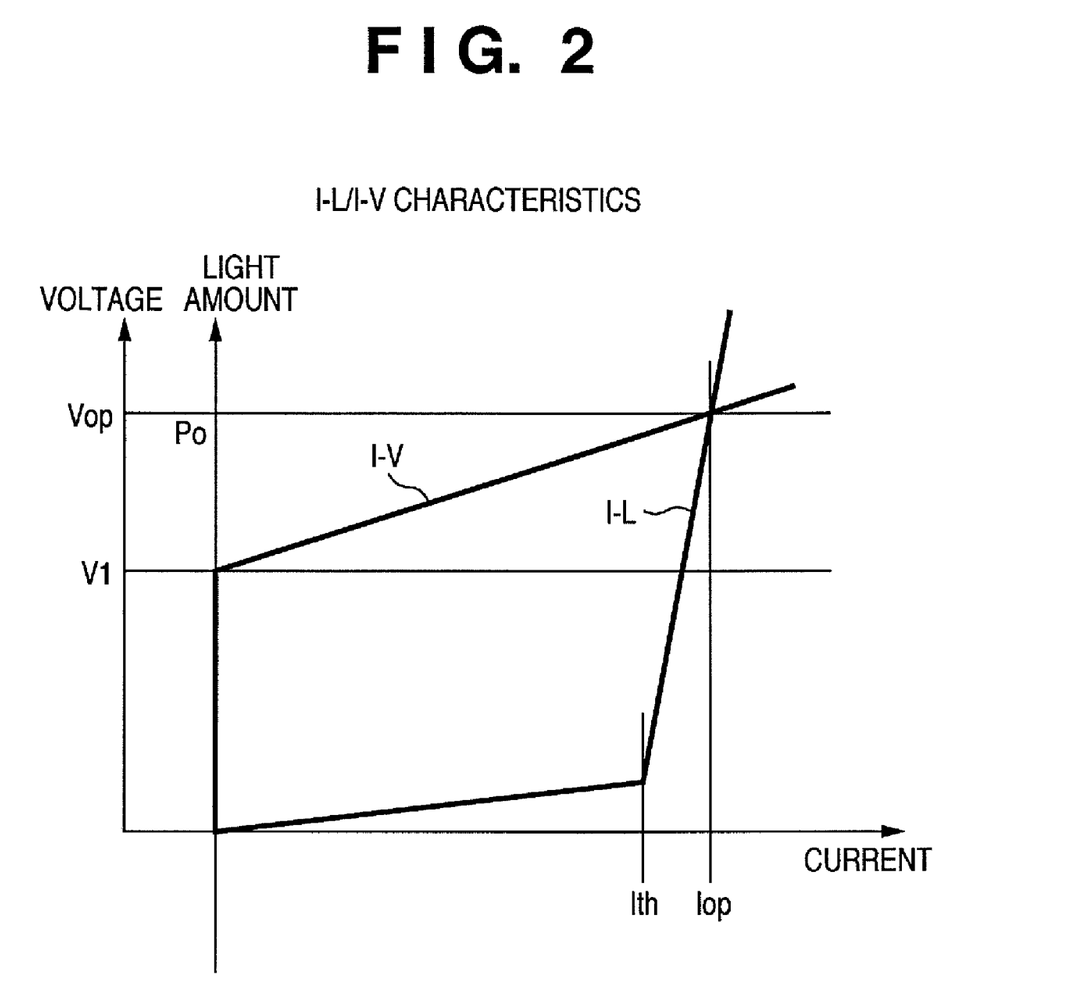
FIG. 2 is a curve representing I-L/I-V characteristics of a laser diode.

The operation in the foregoing configuration will be explained using the I-L/I-V characteristics as illustrated in FIG. 2. The targeted luminescence is designated by Po. According to FIG. 2, in order to obtain the amount of light output Po, the current applied to the laser diode 17 must be Iop. Therefore, if the current applied to the laser diode 17 is maintained to Iop, the target light amount Po is obtained. In addition, when the current applied to the laser diode 17 becomes Iop, the forward voltage across the laser diode is Vop.

In order to control the current, the current source 10 requires a certain degree of potential difference across it. Therefore, Vcc is required to be a voltage that is the sum of Vop and a certain degree of potential difference to control the current.

However, since switching element 11 has to withstand the voltage Vcc, if the voltage Vop is high, the switching element must withstand a high voltage and productivity is reduced.

Figure 1:
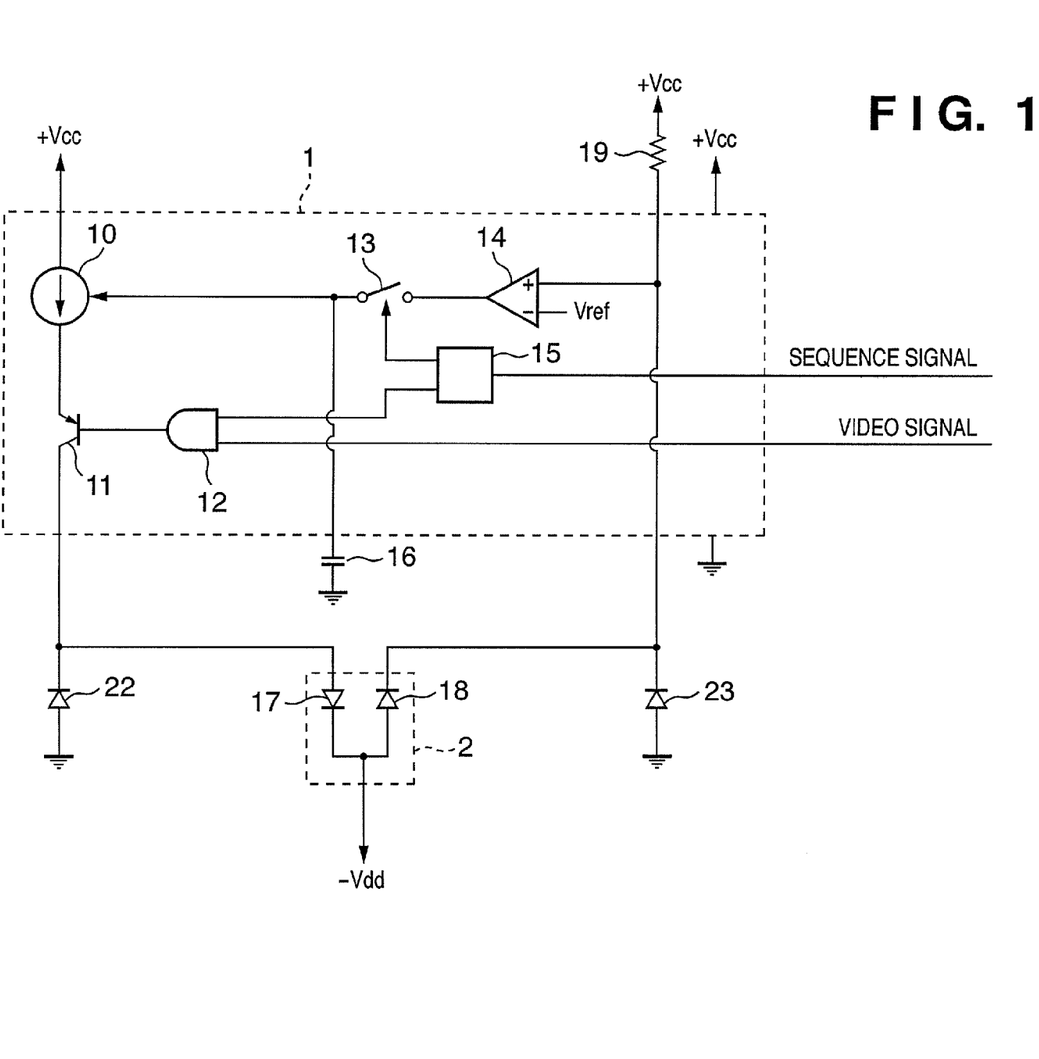
FIG. 1 is a circuit diagram illustrating a configuration according to a First Embodiment.

Thus, a semiconductor-laser drive circuit according to the First Embodiment of the present invention has been designed as illustrated in FIG. 1. In FIG. 1, compared with FIG. 7 that illustrates prior art technology, the common terminal of the laser diode 17 cathode and the anode of the photo diode 18, both part of the light emitting device 2, is connected to a second power source that supplies a negative voltage −Vdd. In this case, the power source Vcc functions as a first power source. In addition, the photo diode 18 is an example of light-sensitive devices.

The anode terminal of the laser diode 17 is grounded via diode 22. The cathode terminal of photo diode 18 is connected to resistor 19 and grounded via diode 23.

Diodes 22 and 23 function as voltage clamp circuits so that the voltages of the output terminal of the switching element 11 and the "+" input terminal of the error amplifier 14 remain higher than the GND level.

In particular, diodes 22 and 23 are used to prevent the voltage of the input terminal of the IC from becoming a negative value in the case where the light amount of the laser is large, making the output of the photo diode 18 large.

Next, the operation in the foregoing configuration will be explained by utilizing the I-L/I-V characteristics as illustrated in FIG. 2. The differential voltage between Vcc and −Vdd is set to a voltage sufficiently higher than Vop. If V1 denotes the voltage at which the forward current starts to flow, −Vdd is set to a voltage sufficiently higher than the differential voltage between Vop and V1. Additionally, the absolute value of voltage −Vdd is set to a voltage approximately equal or less than V1.

In addition, V1 has been defined here as a voltage at which the forward current does not flow. However, V1 may also be defined as a voltage at which, even though the forward current flows, laser oscillations do not start. If the absolute value of voltage −Vdd is equal or lower than voltage V1 at which no laser oscillation starts, laser exposure does not occur as a result.

In the foregoing configuration, during the illumination of the laser diode, maintaining the current to the laser diode 17 at Iop, allows the drive circuit to obtain the target light output Po.

In this situation, because the differential voltage between Vcc and −Vdd is set to a voltage sufficiently higher than Vop, Vop can be applied to the forward voltage of the laser diode, and a sufficient light output can be obtained.

Next, when the laser diode is turned off, the switching element 11 is switched off. Accordingly, −Vdd is applied in the forward direction to the laser diode 17 via diode 22. Because −Vdd is approximately equal or lower than V1, as represented by the I-L/I-V characteristics of FIG. 2, no current flows through the laser diode 17, and consequently it does not illuminate. Additionally, since the output-terminal voltage of the switching element 11 is higher than ground level, the voltage to withstand might not be lower than Vcc.

In general, Vop and V1 of a blue laser are approximately 5 V and 3 V respectively. Therefore, by setting Vcc and −Vdd to 5 V and −3 V, respectively, the differential voltage between Vcc and −Vdd becomes 8 V, i.e., a voltage sufficiently higher than 5 V. Moreover, because Vcc is 5 V, a general-purpose and low-cost drive IC can be used.

Furthermore, even though the laser diode is controlled not to irradiate, since a constant voltage is applied to the laser diode the responsiveness can be enhanced in the case the switching device is turned on to make the laser diode irradiate.

Second Embodiment

Figure 3:
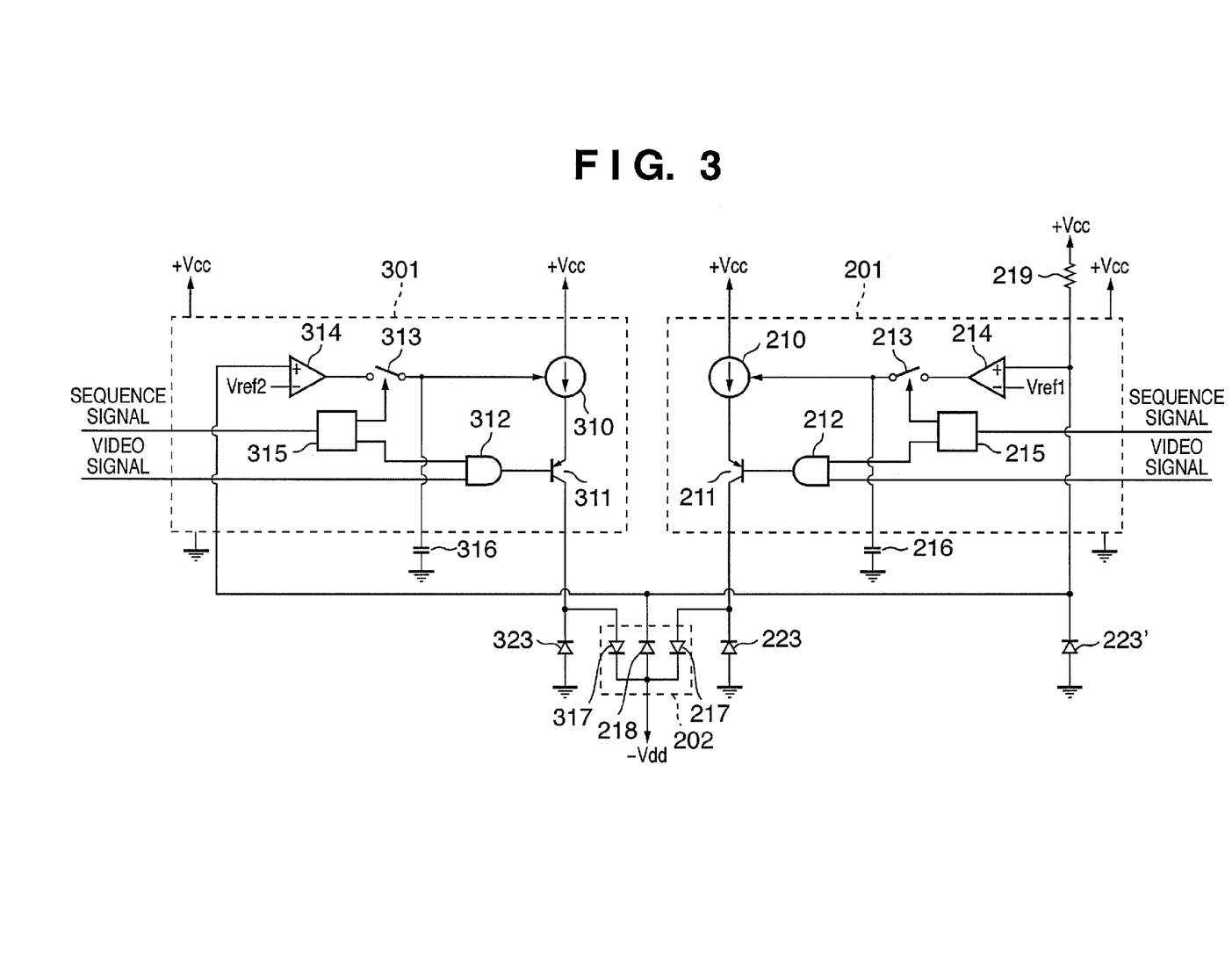
FIG. 3 is a circuit diagram illustrating a configuration according to a Second Embodiment.

FIG. 3 is a diagram illustrating a drive circuit for a semiconductor light source, according to the Second Embodiment of the present invention. In recent years, in order to cope with the advances in electrophotographic equipment, the case might occur where a plurality of laser beams would be created from a single laser package and a plurality of scanning actions would be concurrently executed.

FIG. 3 illustrates a drive circuit in which a two-beam semiconductor laser, among the foregoing semiconductor lasers, is used.

In FIG. 3, light emitting device 202 is a semiconductor laser in which the cathodes of laser diodes 217 and 317 are connected to a common terminal. Diodes 223 and 323 are connected between the respective anodes of the laser diodes 217 and 317, and the GND. The anodes of the laser diodes 217 and 317 are also connected to the output terminals of drive IC 201 and IC 301, respectively. The cathodes of the laser diodes 217 and 317 are connected to a common terminal to which a photo diode 218 and a power source that can supply a voltage of −Vcc are connected.

Drive ICs 201 and 301 each operate similarly to the drive IC of the First Embodiment. In this regard, however, a voltage from the same power source is supplied to the respective "+" input terminals of error amplifiers 214 and 314, by way of a single resister 219, and a diode 223' is provided as a voltage clamp circuit that maintains the voltage higher than the GND level.

As described above, even in the case where a plurality of laser diodes are used, an effect similar to the one described in the First Embodiment can be obtained by applying −Vdd to the common terminal and connecting the diodes between the respective anode terminals for the laser diodes that are connected to the drive ICs and the GND.

Third Embodiment

Figure 4:
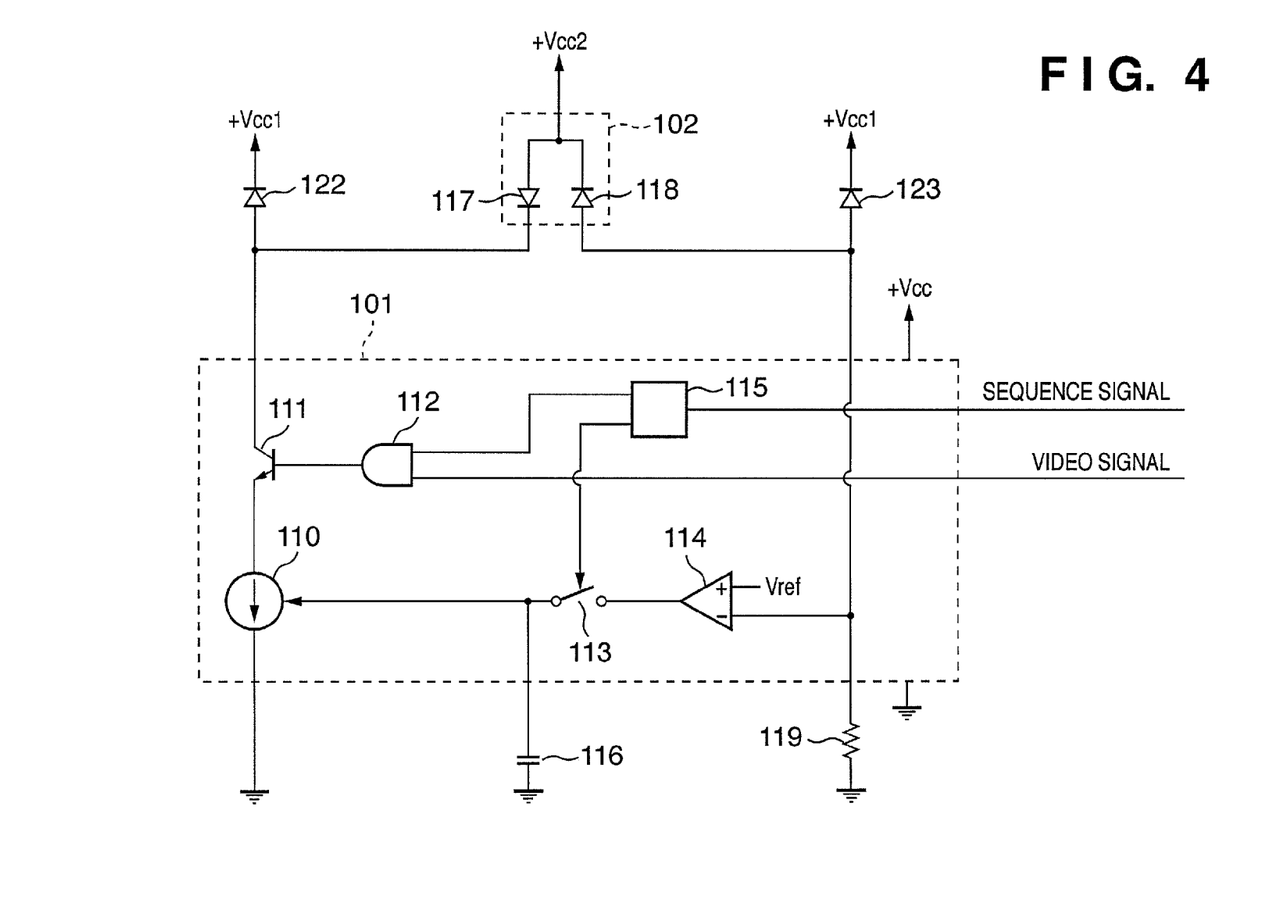
FIG. 4 is a circuit diagram illustrating a configuration according to a Third Embodiment.

FIG. 4 is a diagram illustrating a drive circuit for a semiconductor light source in accordance with the Third Embodiment of the present invention. In the First Embodiment, the cathode of the laser diode 117 and the anode of the photo diode 118 are connected to each other. However, unlike the First Embodiment, in the Third Embodiment, the anode of the laser diode 117 and the cathode of the photo diode 118 are connected to each other.

In FIG. 4, the drive IC 101 has an internal configuration as illustrated within a dotted-line area. A light emitting device 102 includes inside its package a laser diode 117 and a photo diode 118; the anode terminal of the laser diode 117 and the cathode terminal of the photo diode 118 are connected to a common terminal to which Vcc2 is connected as a second power source.

With the anode terminal of the photo diode 118 being grounded via resistor 119, a DC bias voltage is applied to the photo diode 118. The anode terminal of the photo diode 118 is also connected to a "−" input terminal of the error amplifier 114. A reference voltage Vref is applied to the "+" input terminal of the error amplifier 114.

The output terminal of the error amplifier 114 is connected to an analog switch 113 that triggers the ON/OFF control in accordance with the output of the logic circuit 115. The logic circuit 115 receives a sequence signal from a sequence controller (not shown).

The output of the analog switch 113 is inputted to the current source 110 and functions as a signal to control the current outputted from the current source 110. A capacitor 116 is connected between the output terminal of the analog switch 13 and the ground. The output of the current source 110 is inputted into the emitter of the switching element 111.

The collector of the switching element 111 is connected to the cathode of the laser diode 117. The base of the switching element 111 is connected to the output of the logical NAND circuit 112. A logic signal from the logic circuit 115 and a video signal from an image controller (not shown) are inputted into the input terminals of the NAND circuit 112.

The common terminal of the anode of the laser diode 117 and the cathode of the photo diode 118, part of the light emitting device 102, is connected to the power source +Vcc2.

The cathode terminal of the laser diode 117 is connected by way of a diode 122 to +Vcc1 as a first power source. The anode terminal of the photo diode 118 is connected by way of a diode 123 to +Vcc1.

The operation illustrated in FIG. 4 will be explained below. Laser-drive methods utilized in electrophotographic equipment are categorized into several modes. In this regard, the APC luminescence mode which implements constant light amount control will be explained.

First, the state of the APC mode is decided in accordance with an sequence signal (not shown). Then, the logic circuit 115 enables or disables the analog switch 113 and inputs a Lo-level signal to the NAND circuit 112. Regardless of the video signal, the NAND circuit 112 inputs the Hi-level signal to the switching element 111, which turns it on.

In this situation, when the laser diode 117 irradiates, monitor light enters the photo diode 118 inducing a current. The induced current flows through the resistor 119. If Imon and R denote the induced current and the resistance value respectively, a voltage of R×Imon is generated, and the input voltage at the "−" input terminal of the error amplifier 114 rises. When the input voltage attains Vref or higher, the output of the error amplifier 114 decreases, and the control input to the current source 110 also decreases.

With the control input being decreased, the output current of the current source 110 decreases, and the input current to the laser diode 117 decreases. Consequently, the light amount decreases. When the light amount decreases, the induced current in the photo diode 118 is reduced, and the input voltage to the "−" input terminal of the error amplifier 114 decreases. When the input voltage becomes Vref or lower, the output of the error amplifier 114 increases, and the control input to the current source 110 also increases. With the control input being increased, the output current of the current source 110 also increases, and the input current to the laser diode 117 increases. Consequently, the light amount increases.

As described above, the present configuration forms a negative feedback circuit and therefore the relation of equation "R×Imon=Vref" is maintained. Because R and Vref are fixed values, Imon is constant. Then, since Imon is proportional to the amount of light outputted from the laser diode 117, a control is implemented in such a way that the amount of light outputted from the laser diode 117 is constant.

Next, the operation in the foregoing configuration will be explained in relation with the I-L/I-V characteristics of FIG. 2. +Vcc2 is set to a voltage sufficiently higher than Vop. If V1 denotes the voltage at which the forward current starts to flow, +Vcc1 is set to a voltage sufficiently higher than the differential voltage between Vop and V1.

Additionally, the differential voltage between +Vcc1 and +Vcc2 is set to a voltage approximately equal or lower than V1. In the foregoing configuration, during the luminescence of the laser diode, the drive circuit controls the current applied to the laser diode so that Iop is obtained. Accordingly, the light output Po is obtained.

In this situation, because +Vcc2 is set to a voltage sufficiently higher than Vop, Vop can be applied to the forward voltage of the laser diode, and sufficient light output will be obtained.

Next, when the laser diode is turned off, the switching element 111 is switched off. Accordingly, a current flows from the laser diode 117 to +Vcc1 via diode 122. Because the differential voltage between +Vcc1 and +Vcc2 is approximately equal or lower than V1, as represented by the I-L/I-V characteristics of FIG. 2, no current flows through the laser diode 117, and the laser diode 117 does not irradiate.

Additionally, the output-terminal voltage of the switching element 111 is lower than +Vcc1, which implies that the withstanding voltage cannot be lower than Vcc1.

In general, Vop and V1 of a blue laser are approximately 5 V and approximately 3 V, respectively. Therefore, by setting +Vcc1 and +Vcc2 to 5 V and 8 V, respectively, a blue laser can be driven by a general-purpose drive IC that operates at 5 V.

In addition, in recent years, normal-rated voltage of power-source tends to be reduced so as to achieve power dissipation reduction of an apparatus. Thus, control ICs using a power-source voltage of 3.3 V have also been requested. In this case, because the forward voltages of an infrared laser and a red laser are approximately 2.5 V, it becomes more difficult to control the laser. However, by applying the Third Embodiment and setting +Vcc1 and +Vcc2 to 3.3 V and 5 V, respectively, one can readily control the laser.

Fourth Embodiment

Figure 5:
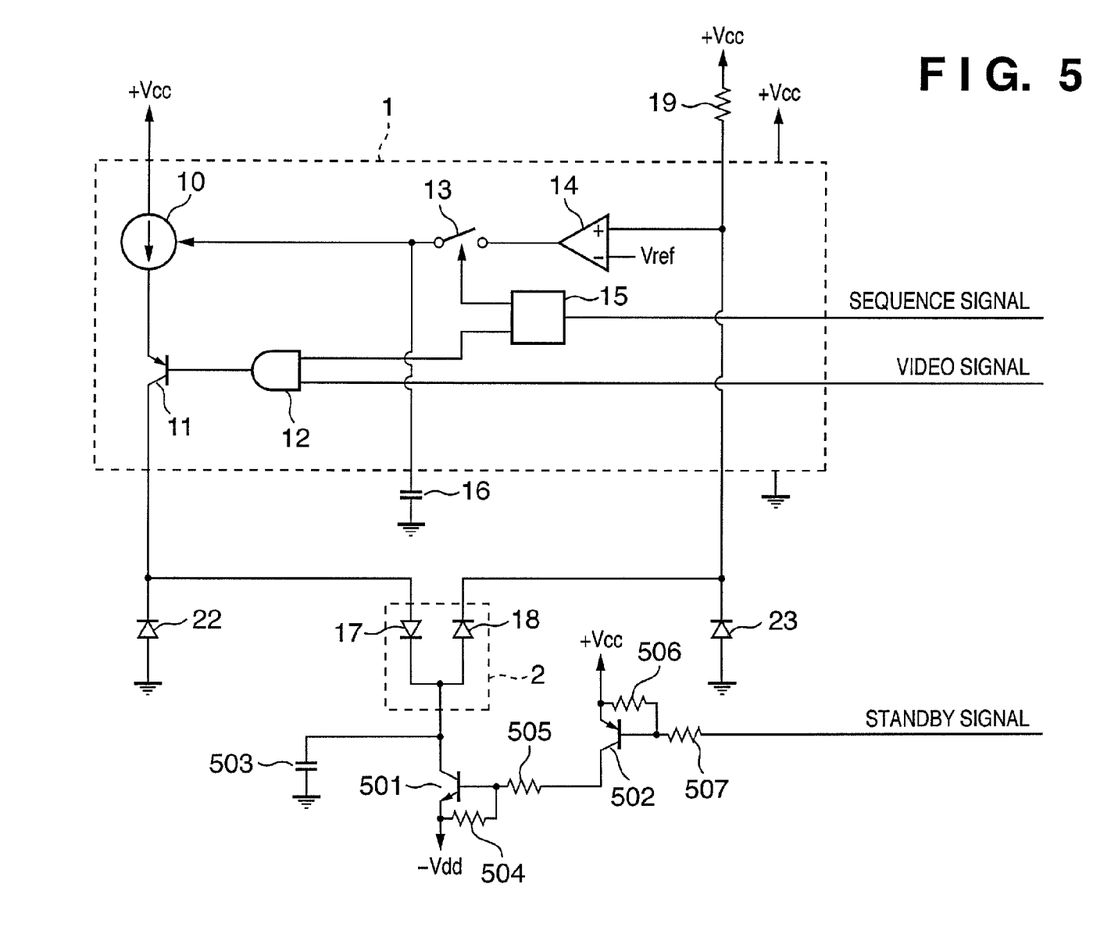
FIG. 5 is a circuit diagram illustrating a configuration according to a Fourth Embodiment.
Figure 6:
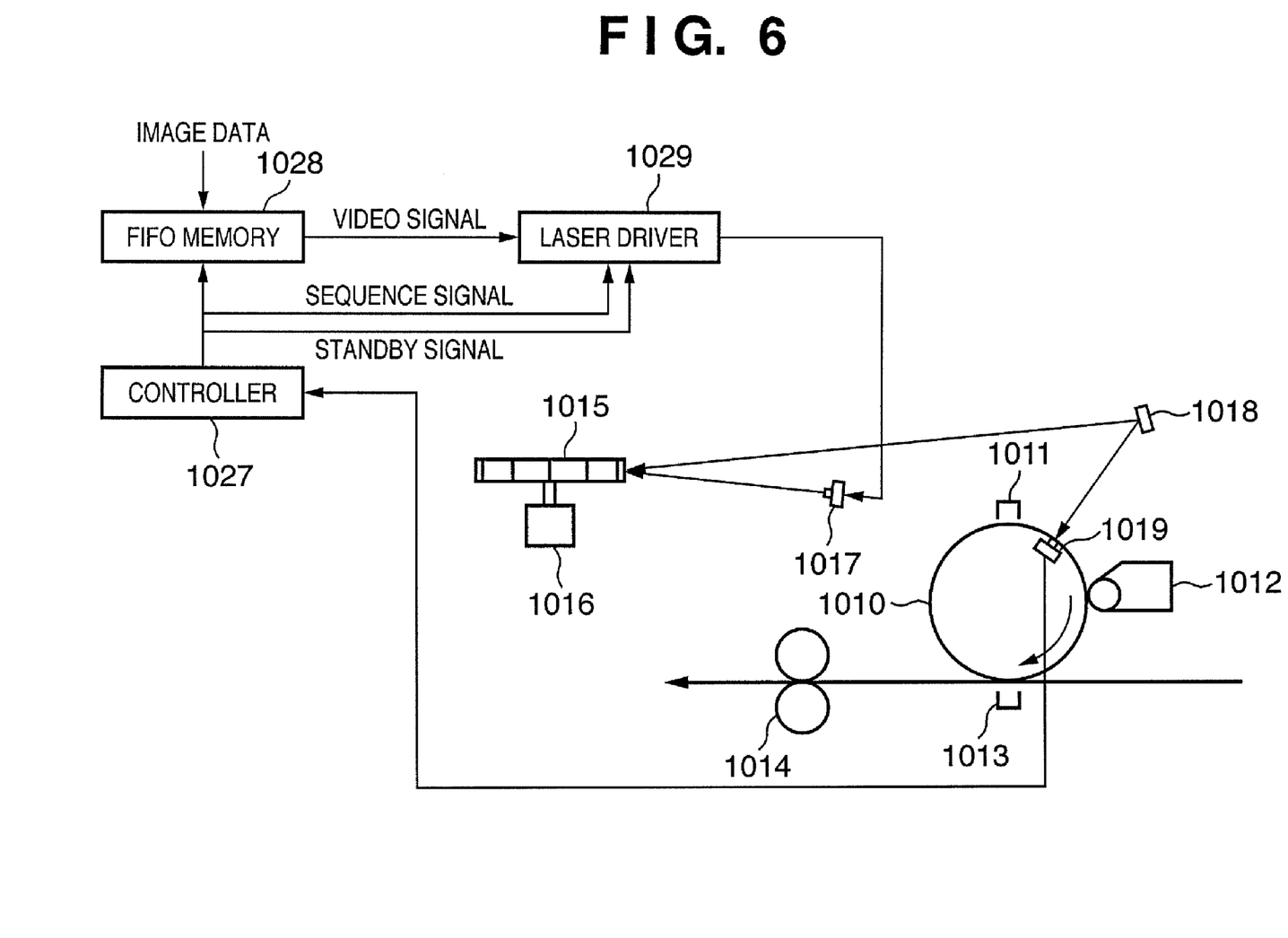
FIG. 6 is a block diagram of a electrophotographic equipment, illustrating a configuration according to a Fourth Embodiment.

FIGS. 5 and 6 are diagrams explaining the Fourth Embodiment. FIG. 5 is a circuit diagram of a laser driver. The laser driver is one type of drive circuit for semiconductor light sources. FIG. 6 is a block diagram of a printer, as an electrophotographic image-forming apparatus using laser drivers. At first, FIG. 6 will be explained.

In FIG. 6, reference numerals 1015 and 1016 denote a rotating polygon mirror and a laser-scanner motor that pivotally drives the rotating polygon mirror 1015. Reference numeral 1017 denotes a laser diode as an exposure light source. The laser diode 1017 is made luminescent or non-luminescent in accordance with an image signal from laser driver 1029. Then an optically modified laser light emitted from the laser diode 1017 is projected onto the rotating polygon mirror 1015.

The rotating polygon mirror 1015 rotates in the direction indicated by the arrow. The laser light emitted from the laser diode 1017 is reflected as a deflection beam that, in accordance with the rotation of the rotating polygon mirror 1015, continually changes its angle corresponding to the reflection planes.

After receiving distortion-aberration correction and the like by a group of lenses (not shown), the reflected light scans a photoconductive drum 1010 in the main scanning direction, by way of a reflection mirror 1018. Each face of the rotating polygon mirror 1015 corresponds to a one-line scanning. Then rotation of the rotating polygon mirror 1015 makes the laser beam emitted from the laser diode 1017 scan line by line the photoconductive drum 1010 in the main scanning direction.

The photoconductive drum 1010 that has been preliminarily charged by a charging device 1011 is sequentially exposed by the laser beam scan, and an electrostatic latent image is formed. In addition, the photoconductive drum 1010 rotates in the direction indicated by the arrow. Then, a developing device 1012 develops the formed electrostatic latent image, and the developed visible image is transferred via a transfer charging device 1013 to a sheet of transfer paper. The transfer paper onto which the visible image has been transferred is transported to a fixing device 1014, and discharged from the printer after the visible image is fixed.

In this situation, a BD sensor 1019 is arranged in the vicinity of the position, on the side portion of the photoconductive drum 1010, at which scanning in the main scanning direction starts, or at a corresponding position. Before starting line-by-line scanning, respective laser beams that have been reflected on the reflection faces of the rotating polygon mirror 1015 are detected by the BD sensor 1019. The BD sensor 1019 out puts BD signal when the BD sensor 1019 detects laser beam. The BD signal, serving as a reference signal for the start of the scanning procedure in the main scanning direction, is inputted into a timing controller 27.

The controller 1027 creates timing signals for a FIFO memory 1028 and a laser driver 1029 so that respective writing-start positions of the scanning lines in the main scanning direction are synchronized with respect to the signal from the BD sensor 1019, and controls the FIFO memory 1028 and the laser driver 1029. With the foregoing configuration, an image is formed.

Next, the circuit diagram in FIG. 5 will be explained. In FIG. 5, the common terminal of the light emitting device 2 is connected to the collector of a transistor 501 and grounded by way of capacitor 503. The emitter of the transistor 501 is connected to −Vdd. The base of the transistor 501 is connected to the collector of the transistor 502, by way of resister 505, and connected to −Vdd, by way of resister 504.

The emitter of the transistor 502 is connected to +Vcc. The base of the transistor 502 is connected to +Vcc, by way of resister 506, and a standby signal from the controller 1027 as illustrated in FIG. 6 is inputted to the base of the transistor 502, by way of resister 507. Other parts in FIG. 5 are the same as those identified in the First Embodiment.

In FIG. 5, during the printing sequence, the Lo signal, serving as the standby signal coming from the controller 1027, as illustrated by FIG. 6, is inputted into the base of the transistor 502. Accordingly, the transistor 502 turns on as well as transistor 501. Consequently, −Vdd is applied to the common terminal of the light emitting device 2, and the same operation as for the First Embodiment is implemented.

Next, during the image-forming standby mode, the Hi signal, serving as the standby signal coming from the controller 1027 as illustrated by FIG. 6 is inputted to the base of the transistor 502. Accordingly, the transistor 502 turns off as well as transistor 501.

As a result, no voltage is applied to the common terminal of the light emitting device 2, and therefore, no current flows through the laser diode 17. In general, if a voltage is applied to a semiconductor laser, a current flows in, and therefore, even though the semiconductor laser does not irradiate, electric power is dissipated, which shortens the lifetime of the laser.

In light of this, the Fourth Embodiment can prevent the lifespan of the laser from being shortened by cutting off the current supply to the laser in the case the laser is not irradiating. In this sense, the circuit illustrated in FIG. 5 functions as a life extension circuit for the laser. Additionally, because the dissipated current is reduced, the circuit illustrated in FIG. 5 also functions as a power saving circuit.

In addition, in the Fourth Embodiment, the printer in FIG. 6 has been explained as an example of an image-forming apparatus to which the circuit illustrated in FIG. 5 is applied. However, any one of the drive circuits of the First Embodiment to the Third Embodiment can be applied to the printer illustrated in FIG. 6. Moreover, the laser-life-extension/power-saving circuit illustrated in FIG. 5 may be applied to the First Embodiment up to the Fourth Embodiment described above.

In other words, according to the First Embodiment up to the Fourth Embodiment described above, electrophotographic equipment in which a semiconductor laser is used for exposure, an independent power source for driving a laser diode is provided in addition to a power source for the proper operation of a drive IC.

Accordingly, driving a high-voltage laser diode, especially a blue laser, through a conventional low-voltage drive IC can readily be implemented. In consequence, because, compared with conventional infrared lasers, its wavelength remains short, the spot shape can readily be downsized, and high image quality and stability can be obtained.

Moreover, in the case where, regardless of the electrophotographic equipment, a laser diode having a forward voltage higher than the withstanding voltage of a drive IC is driven, the present invention is effective.

In addition, in the Embodiments described above, no circuit or no element is inserted between the drive circuit 1 and the light emitting device 2. However, the present invention does not intend to eliminate the insertion of any circuit or any element. In other words, the direct connection of the drive circuit 1 with the light emitting device 2 is not an absolutely necessary requirement. According to the present invention, it is only required for one end of a voltage clamp circuit to be connected to a certain position (connection terminal) in the connection path that connects the drive circuit 1 and the light emitting device 2. In other words, it should be understood that the present invention is different from a solution in which a voltage clamp circuit is inserted into the connection path that connects the drive circuit 1 with the light emitting device 2.

As many apparently widely different embodiments of the present invention can be made without departing from the spirit and scope thereof, it is to be understood that the invention is not limited to the specific embodiments thereof except as defined in the appended claims.

This application claims the benefit of Japanese Patent Application No. 2005-046226 filed on Feb. 22, 2005, which is hereby incorporated by reference herein in its entirety.

What is claimed is:

1. A circuit for driving a semiconductor laser, comprising:
an integrated semiconductor circuit to control the drive of the semiconductor laser, which is connected to one end of the semiconductor laser;
a first power source for supplying a drive voltage to the one end of the semiconductor laser via the semiconductor integrated circuit;
a second power source, connected to the other end of the semiconductor laser, supplying a drive voltage to the other end; and
a voltage clamp circuit, connected to a connection terminal connecting the semiconductor laser and the semiconductor integrated circuit, for adjusting the electric potential of the connection terminal,
wherein the first power source supplies a positive first drive voltage to the anode of the semiconductor laser, the second power source supplies a negative second drive voltage to the cathode of the semiconductor laser, the absolute value of the first drive voltage is smaller than a voltage that is required for the semiconductor laser to irradiate at a targeted light amount, the absolute value of the second drive voltage is equal or smaller than a voltage at which a forward current starts to flow in the semiconductor laser, and the sum of the absolute value of the first drive voltage and the absolute value of the second drive voltage is equal or larger than the voltage that is required for the semiconductor laser to irradiate at the targeted light amount.

2. A circuit for driving a semiconductor laser, comprising:
an integrated semiconductor circuit to control the drive of the semiconductor laser, which is connected to one end of the semiconductor laser;
a first power source for supplying a drive voltage to the one end of the semiconductor laser via the semiconductor integrated circuit;
a second power source, connected to the other end of the semiconductor laser, supplying a drive voltage to the other end; and
a voltage clamp circuit, connected to a connection terminal connecting the semiconductor laser and the semiconductor integrated circuit, for adjusting the electric potential of the connection terminal,
wherein the voltage clamp circuit is a diode connected between the connection terminal connecting the semiconductor laser and the semiconductor integrated circuit, and the GND.

3. A circuit for driving a semiconductor laser, comprising:
a semiconductor integrated circuit to control the driving of the semiconductor laser, which is connected to one end of the semiconductor laser;
a first power source for supplying a drive voltage to a connection terminal connecting the semiconductor laser and the semiconductor integrated circuit;
a second power source, connected to the other end of the semiconductor laser, for supplying a drive voltage to other end; and
a voltage clamp circuit, connected between the connection terminal and the first power source, for adjusting the electric potential of the connection terminal,
wherein the first power source supplies a first drive voltage to the anode of the semiconductor laser, the second power source supplies a second drive voltage to the cathode of the semiconductor laser, the absolute value of the first drive voltage is smaller than a voltage that is required for the semiconductor laser to irradiate at a targeted light amount, the difference between the first drive voltage and the second drive voltage is equal or smaller than a voltage at which a forward current starts to flow in the semiconductor laser, and the absolute value of the second drive voltage is equal or larger than a voltage that is required for the semiconductor laser to irradiate at a targeted light amount.

4. A circuit for driving a semiconductor laser, comprising:
a semiconductor integrated circuit to control the driving of the semiconductor laser, which is connected to one end of the semiconductor laser;
a first power source for supplying a drive voltage to a connection terminal connecting the semiconductor laser and the semiconductor integrated circuit;

a second power source, connected to the other end of the semiconductor laser, for supplying a drive voltage to the other end; and a voltage clamp circuit, connected between the connection terminal and the first power source, for adjusting the electric potential of the connection terminal, wherein the voltage clamp circuit is a diode for keeping the electric potential of the connection terminal connecting the semiconductor laser and the semiconductor integrated circuit equal or lower than the electric potential of the first power source.

5. A drive circuit for driving a semiconductor laser, comprising:

a semiconductor integrated circuit, for controlling the drive of the semiconductor laser, which is connected to one end of a light-sensitive device for receiving monitoring light emitted from a light emitting device included in the semiconductor laser;

a first voltage clamp circuit, connected to a first connection terminal connecting the light-sensitive device and the semiconductor integrated circuit, for adjusting the electric potential of the first connection terminal; and a second voltage clamp circuit, connected to a second connection terminal connecting one end of the light emitting device and the semiconductor integrated circuit, for adjusting the electric potential of the second connection terminal.

* * * * *